United States Patent
Tang et al.

(10) Patent No.: US 9,903,754 B2
(45) Date of Patent: Feb. 27, 2018

(54) LIGHT GUIDING DEVICE AND ELECTRONIC DEVICE HAVING LIGHT CONDUCTING CHANNELS WITH AT LEAST ONE BARRIER OBJECT THEREIN

(71) Applicants: NANNING FUGUI PRECISION INDUSTRIAL CO., LTD., Nanning (CN); HON HAI PRECISION INDUSTRY CO., LTD., New Taipei (TW)

(72) Inventors: Xiao-Hu Tang, Shenzhen (CN); Pei Liu, Shanghai (CN)

(73) Assignees: NANNING FUGUI PRECISION INDUSTRIAL CO., LTD., Nanning (CN); HON HAI PRECISION INDUSTRY CO., LTD., New Taipei (TW)

( * ) Notice: Subject to any disclaimer, the term of this patent is extended or adjusted under 35 U.S.C. 154(b) by 25 days.

(21) Appl. No.: 15/240,277

(22) Filed: Aug. 18, 2016

(65) Prior Publication Data

US 2017/0350751 A1 Dec. 7, 2017

(30) Foreign Application Priority Data

Jun. 3, 2016 (CN) .......................... 2016 1 0389623

(51) Int. Cl.
  *G01J 1/18* (2006.01)
  *H05K 1/02* (2006.01)
  *H05K 1/18* (2006.01)
  *H05K 1/14* (2006.01)

(52) U.S. Cl.
  CPC .............. *G01J 1/18* (2013.01); *H05K 1/0274* (2013.01); *H05K 1/0275* (2013.01); *H05K 1/144* (2013.01); *H05K 1/181* (2013.01); *H05K 2201/042* (2013.01); *H05K 2201/08* (2013.01); *H05K 2201/10121* (2013.01); *H05K 2201/10151* (2013.01); *H05K 2201/10234* (2013.01)

(58) Field of Classification Search
  CPC ....... B60S 1/0833; G01N 21/88; G01R 31/04; G01R 31/2813; G01R 31/309; G01J 1/42
  USPC ................................ 250/221, 227.11, 214 R
  See application file for complete search history.

(56) References Cited

U.S. PATENT DOCUMENTS 8,772,721 B2 * 7/2014 Hasselbrinck ......... B60K 37/06
                                                                  250/338.1

FOREIGN PATENT DOCUMENTS

| CN | 1199698 C | 5/2005 |
| CN | 101290652 A | 10/2008 |
| CN | 102930648 B | 9/2015 |
| TW | 552442 | 9/2003 |

* cited by examiner

*Primary Examiner* — Que T Le
(74) *Attorney, Agent, or Firm* — ScienBiziP, P.C.

(57) ABSTRACT

A security device in an electronic device which protects against unauthorized disassembly includes light sources, a plurality of photosensitive elements, a detection unit, a storage unit, a processor, and light guiding devices. Light conducting channels are provided between the light sources and the induction elements. Barrier objects that block light are installed at certain first light guiding channels of the light guiding channels, and are removed from the first light conducting channels when the electronic device is disassembled, so that induction signals output by the photosensitive elements are changed from the model or original digitally-recorded signals.

10 Claims, 8 Drawing Sheets

LIGHT GUIDING DEVICE AND ELECTRONIC DEVICE HAVING LIGHT CONDUCTING CHANNELS WITH AT LEAST ONE BARRIER OBJECT THEREIN

CROSS-REFERENCE TO RELATED APPLICATIONS

This application claims priority to Chinese Patent Application No. 201610389623.1 filed on Jun. 3, 2016, the contents of which are incorporated by reference herein.

FIELD

The subject matter herein generally relates to security technologies.

BACKGROUND

Equipment manufacturers may need to install a protective structure on equipment in order to know performance history of the equipment or to maintain safety standards. A software self-destruct program of the equipment can be activated if the equipment is disassembled without authorization. Deleting important data internally stored in the equipment or destroying circuits of the equipment can prevent hackers from stealing the important data.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" exemplary embodiment in this disclosure are not necessarily to the same embodiment, and such references mean at least one.

Figure 1:
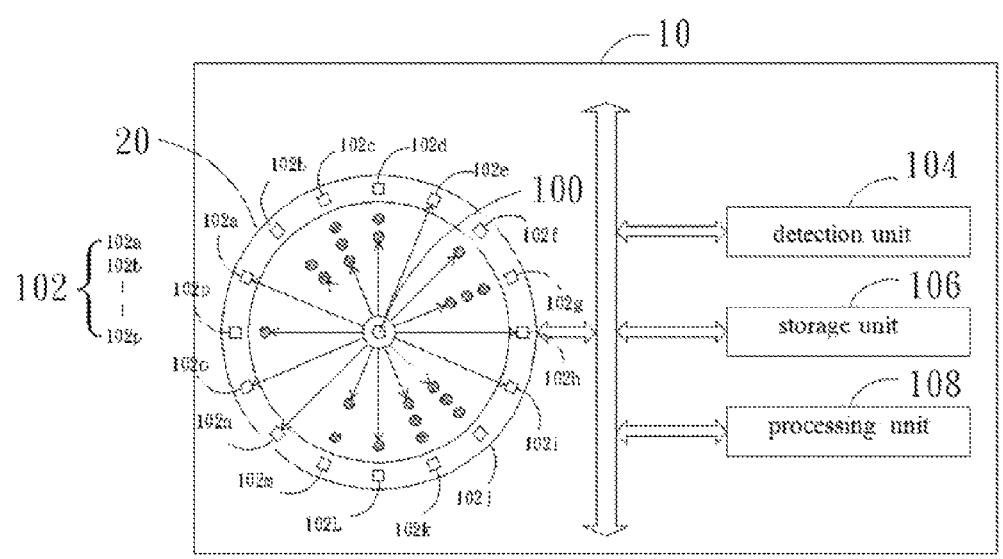
FIG. 1 is a schematic diagram of an exemplary embodiment of an electronic device in accordance with the disclosure.
Figure 2:
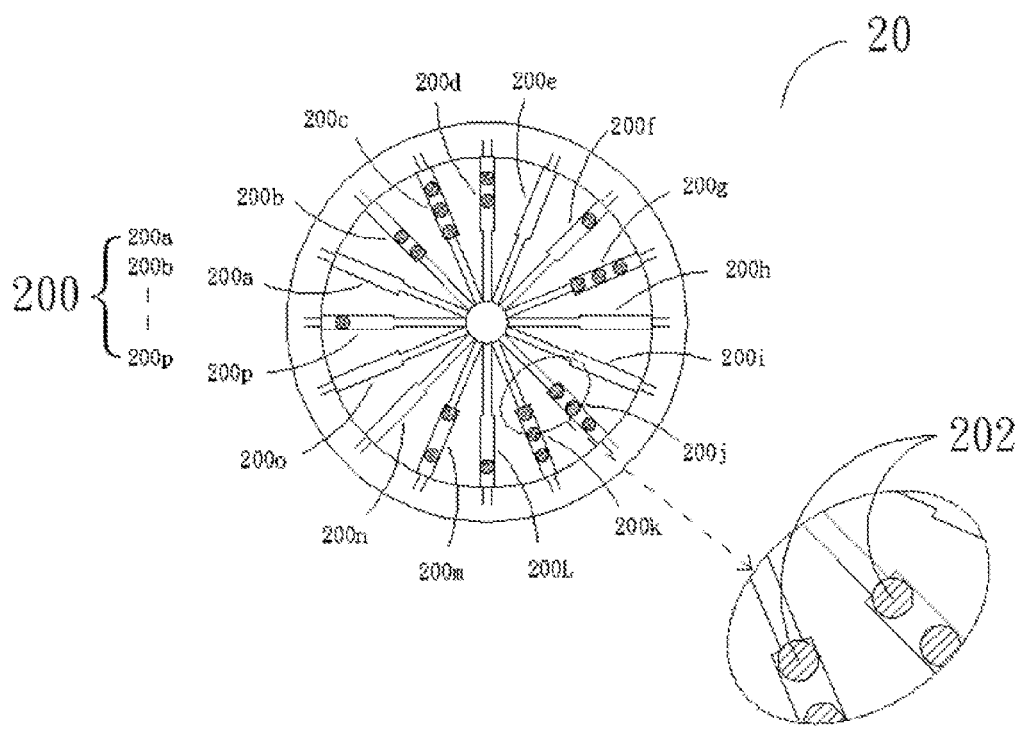
FIG. 2 is a schematic view of a light guiding device of the electronic device of FIG. 1.
Figure 3:
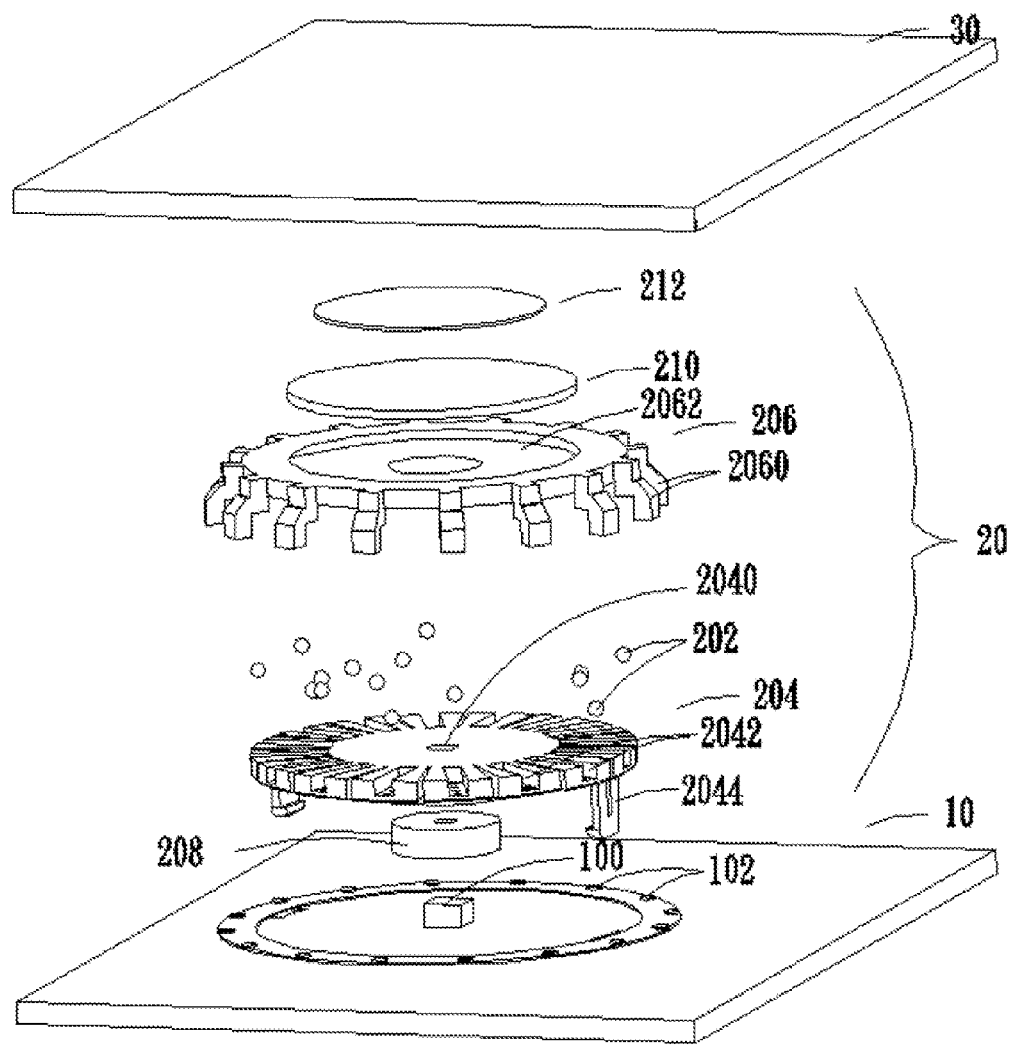
FIG. 3 is an exploded view of the electronic device of FIG. 1

In FIGS. 1-3, the electronic device (not shown) comprises a printed circuit board (PCB) 10 and a light guiding device 20. The PCB 10 comprises one or more light sources 100, a plurality of photosensitive elements 102, a detection unit 104, a storage unit 106, and a processing unit 108. The light sources 100 can be light-emitting diodes or other luminaries. The light sources 100 can be supplied with system power by the electronic device or supplied by a battery. The quantity of the light sources 100 can be larger than 1, for example, can be equal to the quantity of the plurality of photosensitive elements 102.

The photosensitive elements 102 can be photosensitive resistors or other photosensitive components. The quantity of the photosensitive elements is defined as "n". The n is a number that is not less than 3. For example, if n equals 16, the photosensitive elements can be 102a-102p inclusive.

The photosensitive elements 102a-102p output different induction signals according to whether photosensitive elements 102a-102p receives light generated by the light sources 100. The induction signals comprise at least a first induction signal and a second induction signal, such as high and low voltage levels. The photosensitive elements output the first induction signal when the light generated by the light sources 100 is received by the photosensitive elements. Otherwise, the photosensitive elements output the second induction signal when the light generated by the light sources 100 is not received by the photosensitive elements. As FIG. 1 shown, straight lines with arrows between the light sources 100 and the photosensitive elements 102a-102p represent direction of propagation of light for each photosensitive element 102. Obviously, straight lines are different and are determined by whether there are barrier objects 202 between the light sources 100 and the photosensitive elements.

The detection unit 104 connects electrically to the photosensitive elements 102a-102p and detects the induction signals of the photosensitive elements 102a-102p as they occur, or in real-time.

The storage unit 106 stores model induction signals of the photosensitive elements 102a-102p when the electronic device is packaged. The model induction signals are encrypted and stored in the storage unit 106. In an exemplary embodiment, the photosensitive element 102a outputs the first induction signal when the photosensitive element 102a receives light. The first induction signal can be represented by a binary code "1". The photosensitive element 102b outputs a continuous second induction signal if the photosensitive element 102b is not receiving light. The second induction signal can be represented by a binary code "0". The induction signals output by the photosensitive elements 102a-102p constitute a binary code sequence "1000100110000110" in turn, as shown in FIG. 1. The binary code sequence is encrypted and stored in the storage unit 106 and can be derived according to a serial number (SN) of the electronic device using a specific algorithm. Each electronic device sets a specific route to pass through or block light generated by the light sources 100 so that each of the photosensitive elements outputs a different induction signal forming the binary code sequence according to the product SN. The binary code sequence also can be formed according to other product characteristics, such as MAC address of a network equipment.

The processing unit 108 compares the induction signals of the photosensitive elements 102a-102p detected by the detection unit 104 and the model induction signals of the photosensitive elements 102a-102p stored in the storage unit 106 to determine whether the electronic device is disassembled. When the processing unit 108 determines that for at least one photosensitive element, such as 102a, the induction signals of the photosensitive element detected is not consistent with the model induction signals of the photosensitive element, the electronic device is determined to be disassembled. After the electronic device is disassembled, the processing unit 108 compares the induction signals of the photosensitive elements 102a-102p detected and the model induction signals of the photosensitive elements 102a-102p. If and only if the induction signals of the photosensitive elements 102a-102p detected are being the same as the model induction signals, the disassembly of the electronic device can be determined as authorized. The processing unit 108 stores records of determinations in the storage unit 106. The processing unit 108 is also able to lock all functions or some functions of the electronic device, and is able to start a software self-destruct program.

The light guiding device 20 has sixteen light conducting channels 200a-200p, and a certain number of first light conducting channels has at least one barrier object 202, as shown in FIG. 2. Light conducting channels 200b, 200c, 200d, 200f, 200g, 200j, 200k, 200L, 200m and 200p have random numbers of barrier objects. The photosensitive elements 102a-102p output different induction signals based on the presence or absence of at least one barrier object in the light conducting channels 200a-200p. When the number of barriers in the light conducting channels 200 equals to 0, the photosensitive element 102 outputs the first induction signal, otherwise the photosensitive element 102 outputs the second induction signal. The number of barrier objects in each light conducting channels 200 has no effect on the selection to output the second induction signal as long as there is at least one barrier object in the light conducting channels 200, in other words, whether the number of barrier objects in the light conducting channels 200 is 1 or greater than 1 does not change the selection of second induction signal as an output signal. Different number of barrier objects in the light conducting channels 200 can be fully restored after the electronic device has been disassembled, the restoration of barrier objects after disassembly can be used to determine whether the disassembly was authorized or not. For example, the light conducting channel 200a has no barrier object 202, the photosensitive element 102a at the side of the light conducting channel 200a can receive in full the light of the light source 100 through the light conducting channel 200a, so the photosensitive element 102a outputs the first induction signal. Light conducting channel 200b has two barrier objects 202, thus the photosensitive element 102b at the side of the light conducting channel 200b cannot receive light of the light source 100 through the light conducting channel 200b, so the photosensitive element 102b outputs the second induction signal.

The barrier objects 202 are confined in light conducting channels when the electronic device is packaged, therefore, the induction signals of the photosensitive elements 102a-102p cannot be changed unless the electronic device is disassembled. The detection unit 104 stores the induction signals of the photosensitive elements 102a-102p, when detected that the electronic device is packaged, in the storage unit 106 directly by itself or by the processing unit 108. The induction signals of the photosensitive elements 102a-102p as packaged are regarded as the model induction signals. The barrier objects 202 will be partly or entirely out of their light conducting channels 200 when the packaged electronic device is broken or disassembled with or without authorization. In the exemplary embodiment, the barrier objects 202 are spherical in shape, it can also be in other shapes that allow the barrier objects 202 to move within the light conducting channels 200. For example, when the electronic device is disassembled or broken, the barrier objects 202 in the light conducting channel 200b partially or entirely roll out of their light conducting channels 200b so that the photosensitive element 102b can receive partial or full lighting from the light source 100 through the light conducting channel 200b, and the first induction signal output by the photosensitive element 102b will change from the second induction signal to the first induction signal. To determine whether the disassembly of the electronic device is authorized or unauthorized, the induction signals of the photosensitive elements 102a-102p must be detected again when the electronic device is re-packaged after being disassembled. When the re-detected induction signals of the photosensitive elements 102a-102p are the same with the model induction signals, the disassembly of the electronic device is authorized. Otherwise, the disassembly is unauthorized (The barrier objects 202 in each light conducting channel 200b of an authorized disassembly can be restored, which cannot be done in the case of an unauthorized disassembly).

Figure 4:
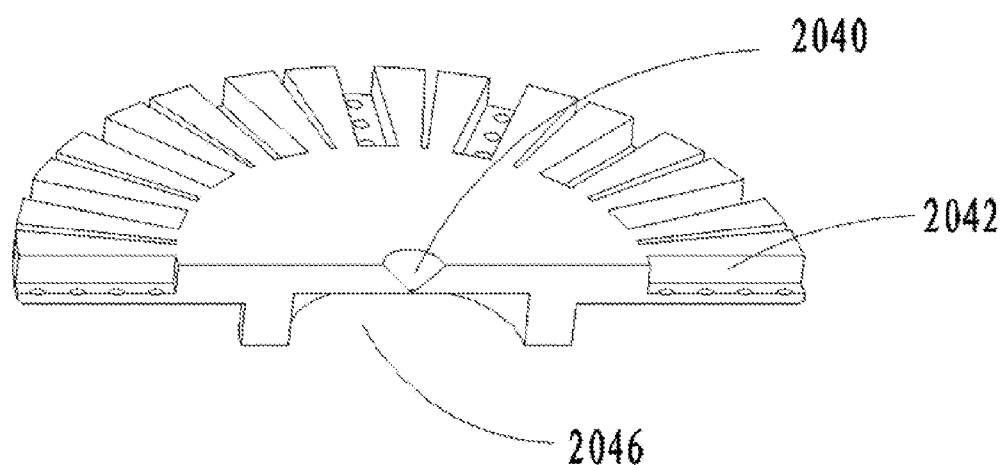
FIG. 4 is a cross sectional view of a first substrate of the electronic device of FIG. 1.

In an exemplary embodiment, as shown in FIG. 3, the light guiding device 20 includes a first substrate 204, a second substrate 206, an elastic sleeve 208, an adsorption element 210, and a bonding element 212. The first substrate 204 and the second substrate 206 are circular and concentric. In conjunction with FIG. 3-FIG. 5, the first substrate 204 can be mounted in the PCB 10 through a mounting structure 2044 or by other ways of mounting. In an exemplary embodiment, the mounting structure 2044 is a pair of protrusions, each protrusion has a groove formed thereon. A first side of the first substrate 204 faces towards the PCB 10. At the first side of the first substrate 204, the first substrate 204 has a first storage structure 2046 that stores a light source 100. The first storage structure 2046 defines an opening facing towards the PCB 10. In the exemplary embodiment, the first storage structure 2046 is a cylindrical structure with an opening at one side and the first storage structure 2046 includes a chamfered structure 2040 at a top surface thereof. As shown in FIG. 3, the chamfered structure 2040 can be a v-shaped opening, guiding the light from the light source 100 to enter into each of the light conducting channels 200a-200p. All or some of the light conducting channels 200a-200p are distributed in the first substrate 204. Each of the light conducting channels 200a-200p defines a light groove 2042. The light groove 2042 defines an opening at the other side of the first substrate 204. The light groove 2042 can allow light to pass through or receive the barrier objects 202.

Figure 5:
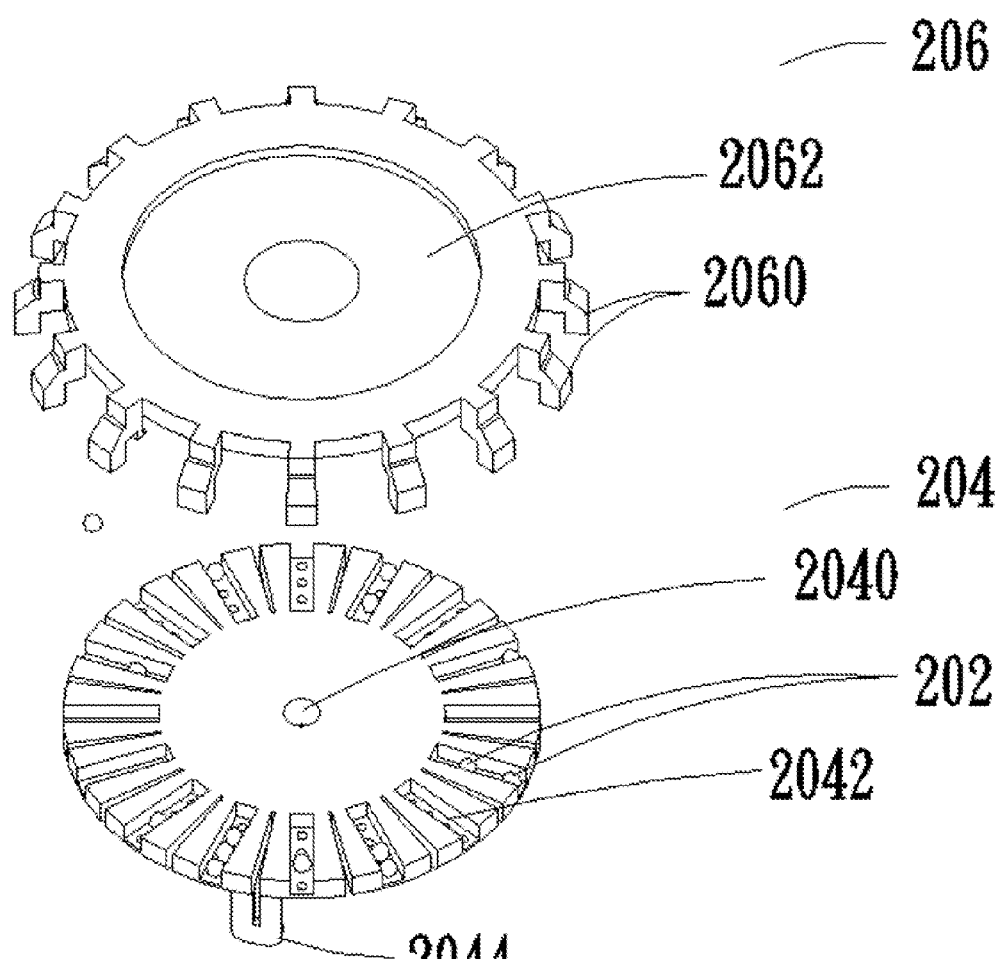
FIG. 5 is a disassembled perspective view of the first substrate, a second substrate, and a barrier object of the electronic device of FIG. 1.

Referring to FIG. 3 and FIG. 5, shape of the first substrate 204 and the second substrate 206 are matching in shape. A first side of the second substrate 206 is on a second side of the first substrate 204. That is, the first side of the second substrate 206 is relative to the second side of the first substrate 204. A second storage structure 2062 is formed on the second side of the second substrate 206, an absorbent element 210 can be formed therein. The second substrate 206 abuts the PCB 10 or the first substrate 204 and is bonded on the backward shell 30 of the electronic device through the bonding element 212.

Referring to FIG. 5, a barrier object 202 is positioned at the light groove 2042 of the first substrate 204, and can be easily moved out of light groove 2042.

Figure 6:
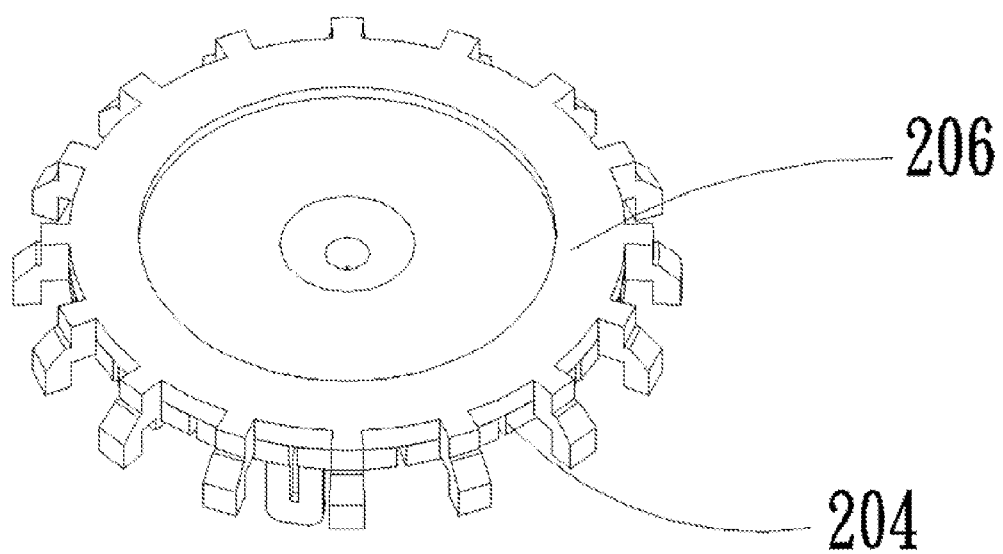
FIG. 6 is an assembled view of the first substrate, the second substrate, and the barrier object of the electronic device of FIG. 1.
Figure 7:
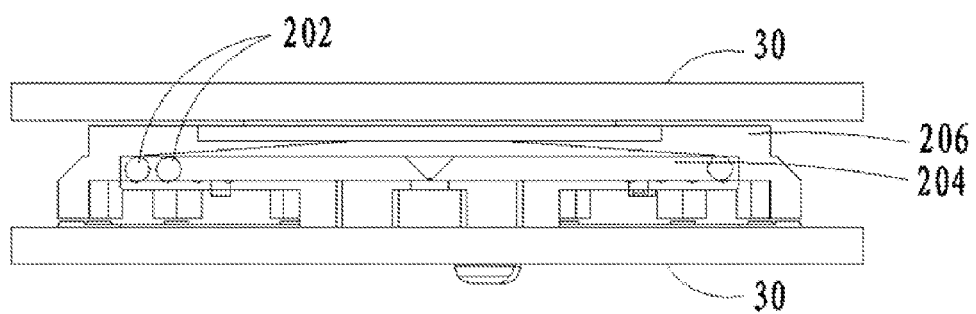
FIG. 7 is a cross sectional view of the assembled electronic device of FIG. 1.

Referring to FIG. 6 and FIG. 7, when the electronic device is packaged, the first side of the second substrate 206 confines the barrier object 202 within the light groove 2042.

Therefore, the induction signals of the photosensitive elements 102a-102p should be non-varying after the electronic device is packaged.

Figure 8:
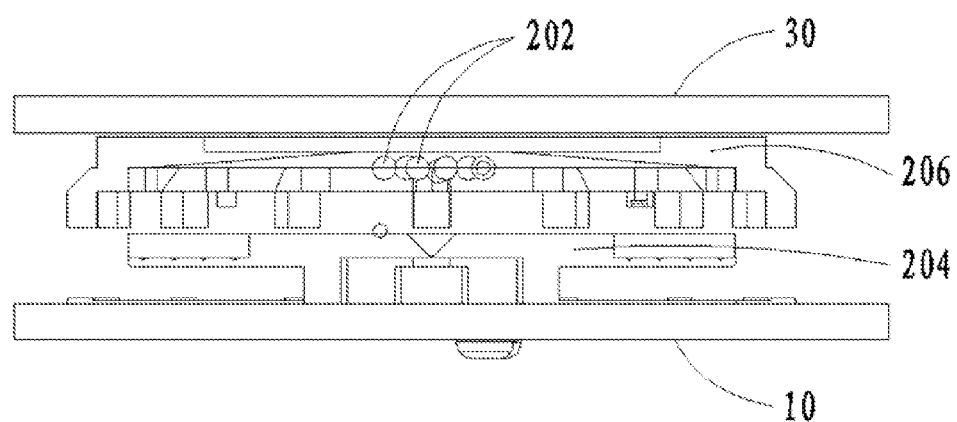
FIG. 8 is a cross sectional view of the disassembled electronic device of FIG. 1.

Referring to FIG. 8, when the electronic device is disassembled, the second substrate 206 is removed from the first substrate 204 with the backward shell 30 of the electronic device, because the second substrate 206 is bonded on the backward shell 30 of the electronic device. The adsorption element 210 is formed on the second substrate 206. When the first substrate 204 and the second substrate 206 are disassembled, the barrier object 202 is adsorbed to the second substrate 206, causing the adsorption element 210 installed in advance to be removed from the light groove 2042. That is, the barrier object 202 or a plurality of barrier objects 202 are removed from their respective light conducting channels 200.

The barrier objects 202 are magnetic or metal spheres, such as an iron ball or other magnetic ball. The adsorption element 210 is a magnetic object.

In an exemplary embodiment, a first side of the second substrate 206 towards the first substrate 204 is recessed by being inwardly tapered. The barrier objects 202 can slide and gather into one place when the barrier objects 202 are adsorbed to the first side of the second substrate 206. A second side of the second substrate 206 is preferably a smooth surface. An unauthorized disassembler cannot restore the original location of the barrier objects when the barrier objects 202 gather into one place, so a determination can be easily made that the structure has been disassembled without authorization.

In an exemplary embodiment, the photosensitive elements 102a-102p are evenly distributed in a peripheral portion of the light source 100.

In an exemplary embodiment, the light guiding device 20 is made of an opaque material.

In an exemplary embodiment, each light conducting channel includes a second light conducting channel 2060 in the first substrate 204 and a third light conducting channel 2060 in the second substrate 206. As FIG. 5 shows, sixteen second light conducting channels, not marked in FIG. 5, are distributed in the first substrate 204. Referring to the light groove 2042, the light groove 2042 belongs to a part of the second light conducting channel 2060. Sixteen third light conducting channels 2060 are evenly distributed in the first substrate 206 at the edge of the second substrate 206 in the circumferential direction. One side of each of the second light conducting channels, regarded as an entry point of light of the light source 100, is located at the inner wall of the first storage structure 2046. The other side of each of the second light conducting channel, regarded as an exit point of light of the light source 100, is connected to the third light conducting channel 2060. The other side of each of the second light conducting channels points to a photosensitive element. The lighting of the light source 100 can be imported to the photosensitive elements 102a-102p when the electronic device is packaged, which reduces the chances of cracking.

In an exemplary embodiment, an elastic sleeve 208 is formed between the first storage structure 2046 of the first substrate 204 and the light source 100 to prevent the light source 100 and inner wall of the first storage structure 2046 from physically interfering or skewing with respect to each other.

While the exemplary embodiments have been described, it should be understood that it has been presented by way of example only and not by way of limitation. The breadth and scope of the disclosure should not be limited by the described exemplary embodiments, but only in accordance with the following claims and their equivalents.

What is claimed is:

1. A light guiding device packaged between a printed circuit board (PCB) and a shell of an electronic device, the PCB including a light source and a plurality of photosensitive elements, the device comprising:
   a plurality of light conducting channels corresponding to the photosensitive elements;
   wherein the light conducting channels comprises a plurality of first light conducting channels including at least one barrier object therein, the photosensitive elements output different induction signals corresponding to the presence or absence of at least one barrier object in the light conducting channels; and
   wherein the barrier objects are confined in their corresponding light conducting channels; wherein when the packaged electronic device is disassembled, the barrier objects are removed from their corresponding light conducting channels.

2. The light guiding device as claimed in claim 1, further comprising:
   a first substrate mounted in the PCB; and
   a second substrate mounted on the first substrate, the PCB, or the combination thereof;
   wherein the second substrate has an adsorption element; wherein the second substrate is mounted in the shell of the electronic device when the electronic device is packaged; wherein each of the light conducting channels is entirely or partly installed in the first substrate, each of the light conducting channels defines a light groove in the first substrate such that light passes through the light groove and the barrier objects are received in the light groove;
   wherein when the electronic device is packaged, the second substrate is on the first substrate and the barrier objects are confined in the light groove; and
   wherein when the electronic device is disassembled, the second substrate is removed from the first substrate with the shell of the electronic device, the adsorption element absorbs the barrier objects to the second substrate, and the barrier objects are removed from the light groove.

3. The light guiding device as claimed in claim 2, wherein each of the light conducting channels comprises a second light conducting channel in the first substrate and a third light conducting channel in the second substrate.

4. The light guiding device as claimed in claim 2, wherein the first substrate includes a first storage structure storing the light source, the first storage structure defines an opening facing towards the printed circuit board, and the first storage structure includes a chamfer at a top surface thereof to guide light from the light source into each of the light conducting channels.

5. The light guiding device as claimed in claim 2, wherein a surface of the second substrate faces towards the first substrate, and the surface of the second substrate has a concavity towards the first substrate.

6. The light guiding device as claimed in claim 2, wherein barrier objects are magnetic or metal spheres and the adsorption element is a magnetic object.

7. A electronic device comprising a printed circuit board (PCB), comprising:
   a light source;
   a plurality of photosensitive elements;
   a detection unit, the detection unit detecting a plurality of induction signals of the photosensitive elements;

a storage unit, storage unit storing a plurality of model induction signals of the photosensitive elements when the electronic device is packaged;

a processing unit, processing unit comparing the induction signals detected and the model induction signals to determine whether the electronic device is disassembled; and a light guiding device.

8. The electronic device as claimed in claim 7, wherein the processing unit compares the induction signals detected and the model induction signals to determine whether the electronic device is disassembled without authorization when the electronic device is disassembled.

9. The electronic device as claimed in claim 7, wherein the photosensitive elements are evenly distributed in a peripheral portion of the light source.

10. The electronic device as claimed in claim 7, wherein the model induction signals are encrypted and stored in the storage unit.

* * * * *